(12) United States Patent
Paolilli et al.

(10) Patent No.: US 8,795,803 B2
(45) Date of Patent: Aug. 5, 2014

(54) MULTI-LAYER HIGH MOISTURE BARRIER POLYLACTIC ACID FILM

(71) Applicant: Toray Plastics (America), Inc., N. Kingstown, RI (US)

(72) Inventors: Tracy A. Paolilli, East Greenwich, RI (US); John J. Fitch, Middletown, RI (US)

(73) Assignee: Toray Plastics (America), Inc., N. Kingstown, RI (US)

( * ) Notice: Subject to any disclaimer, the term of this patent is extended or adjusted under 35 U.S.C. 154(b) by 0 days.

(21) Appl. No.: 13/754,215

(22) Filed: Jan. 30, 2013

(65) Prior Publication Data

US 2013/0143064 A1    Jun. 6, 2013

Related U.S. Application Data

(62) Division of application No. 12/890,349, filed on Sep. 24, 2010.

(60) Provisional application No. 61/246,048, filed on Sep. 25, 2009.

(51) Int. Cl.

| | |
|---|---|
| *B32B 15/04* | (2006.01) |
| *B32B 15/08* | (2006.01) |
| *B32B 15/09* | (2006.01) |
| *B32B 15/16* | (2006.01) |
| *B32B 15/20* | (2006.01) |
| *B32B 27/08* | (2006.01) |
| *B32B 27/14* | (2006.01) |
| *B32B 27/30* | (2006.01) |
| *B32B 27/36* | (2006.01) |
| *B32B 5/00* | (2006.01) |
| *B32B 5/14* | (2006.01) |

(52) U.S. Cl.
USPC ....... 428/36.6; 428/195.1; 428/201; 428/206; 428/208; 428/457; 428/458; 428/480; 428/483; 428/910; 525/56; 525/57; 525/191; 525/217

(58) Field of Classification Search
None
See application file for complete search history.

(56) References Cited

U.S. PATENT DOCUMENTS

| | | | |
|---|---|---|---|
| 4,189,419 A | 2/1980 | Takemoto et al. | |
| 4,281,045 A | 7/1981 | Sumi et al. | |

(Continued)

FOREIGN PATENT DOCUMENTS

| | | |
|---|---|---|
| CA | 2239671 | 12/1999 |
| DE | 43 13 136 | 10/1994 |

(Continued)

OTHER PUBLICATIONS

Cloutier et al., Office Action mailed Jun. 19, 2013, directed to U.S. Appl. No. 12/542,428; 10 pages.

(Continued)

*Primary Examiner* — Vivian Chen
(74) *Attorney, Agent, or Firm* — Morrison & Foerster LLP

(57) ABSTRACT

A laminate film including a first core polylactic acid layer, a coating receiving-layer of polylactic acid, and coated on one side of the coating receiving-layer with PVOH, EVOH, a blend of crosslinked EVOH/PVOH, vinyl alcohol-vinylamine (PVAm) copolymer, anionic carboxylated styrene-butadiene copolymer (SBR) emulsion, or blends thereof. This coating may be applied after the machine-direction orientation step and dried and oriented in a transverse direction orientation oven if in-line coating is desired; or applied to the film in an off-line coating method and dried in an air flotation oven. The dried coating layer can be metallized. This laminate film exhibits excellent gas and moisture barrier properties, appearance, and metal adhesion. It may also optionally include a heat sealable or winding improving layer on the side opposite the coating receiving-layer of the core layer.

5 Claims, 2 Drawing Sheets

(56) References Cited

U.S. PATENT DOCUMENTS

| | | |
|---|---|---|
| 4,310,578 A | 1/1982 | Katsura et al. |
| 4,379,914 A | 4/1983 | Lundberg |
| 4,410,595 A | 10/1983 | Matsumoto et al. |
| 4,464,438 A | 8/1984 | Lu |
| 4,632,959 A | 12/1986 | Nagano |
| 4,745,171 A | 5/1988 | Sato et al. |
| 4,828,920 A | 5/1989 | Nakabayashi et al. |
| 4,877,685 A | 10/1989 | Bergstrom et al. |
| 5,147,726 A | 9/1992 | Suzuki et al. |
| 5,153,074 A | 10/1992 | Migliorini |
| 5,155,160 A | 10/1992 | Yeh et al. |
| 5,175,054 A | 12/1992 | Chu |
| 5,192,620 A | 3/1993 | Chu et al. |
| 5,216,050 A | 6/1993 | Sinclair |
| 5,359,026 A | 10/1994 | Gruber |
| 5,391,423 A | 2/1995 | Wnuk et al. |
| 5,443,780 A | 8/1995 | Matsumoto et al. |
| 5,444,107 A | 8/1995 | Ajioka et al. |
| 5,473,439 A | 12/1995 | Pappas |
| 5,484,881 A | 1/1996 | Gruber et al. |
| 5,489,474 A | 2/1996 | Shinoda et al. |
| 5,556,711 A | 9/1996 | Ajioka et al. |
| 5,585,191 A | 12/1996 | Gruber et al. |
| 5,631,066 A | 5/1997 | O'Brien |
| 5,631,498 A | 5/1997 | Anschel et al. |
| 5,731,093 A | 3/1998 | Chang et al. |
| 5,849,374 A | 12/1998 | Gruber et al. |
| 5,849,401 A | 12/1998 | El-Afandi et al. |
| 5,908,918 A | 6/1999 | Chen et al. |
| 5,939,467 A | 8/1999 | Wnuk et al. |
| 6,005,068 A | 12/1999 | Gruber et al. |
| 6,033,747 A | 3/2000 | Shiotani |
| 6,080,478 A | 6/2000 | Karhuketo |
| 6,096,431 A | 8/2000 | Matsudaira et al. |
| 6,106,950 A | 8/2000 | Searle et al. |
| 6,121,410 A | 9/2000 | Gruber et al. |
| 6,143,408 A | 11/2000 | Fujita |
| 6,153,276 A * | 11/2000 | Oya et al. ............ 428/35.2 |
| 6,171,714 B1 | 1/2001 | Bergkessel et al. |
| 6,211,290 B1 | 4/2001 | Xiao et al. |
| 6,248,430 B1 | 6/2001 | Toyoda et al. |
| 6,312,823 B1 | 11/2001 | El-Afandi et al. |
| 6,322,899 B1 | 11/2001 | Karhuketo et al. |
| 6,326,440 B1 | 12/2001 | Terada et al. |
| 6,350,530 B1 | 2/2002 | Morikawa et al. |
| 6,353,086 B1 | 3/2002 | Kolstad et al. |
| 6,472,081 B1 | 10/2002 | Tsai et al. |
| 6,500,556 B1 | 12/2002 | Morris et al. |
| 6,514,602 B1 | 2/2003 | Zhao et al. |
| 6,521,336 B2 | 2/2003 | Narita et al. |
| 6,544,369 B1 | 4/2003 | Kitamura et al. |
| 6,566,426 B1 | 5/2003 | Kanaida et al. |
| 6,600,008 B1 | 7/2003 | Kobayashi et al. |
| 6,649,103 B1 | 11/2003 | Bousmina et al. |
| 6,649,732 B2 | 11/2003 | Kobayashi et al. |
| 6,713,175 B1 | 3/2004 | Terada et al. |
| 6,787,245 B1 | 9/2004 | Hayes |
| 6,808,795 B2 | 10/2004 | Noda et al. |
| 6,821,373 B1 | 11/2004 | Berlin et al. |
| 6,841,597 B2 | 1/2005 | Bastioli et al. |
| 6,844,077 B2 | 1/2005 | Squier et al. |
| 7,067,596 B2 | 6/2006 | Bastioli et al. |
| 7,070,803 B2 | 7/2006 | Shinhoj et al. |
| 7,087,313 B2 | 8/2006 | Sawai et al. |
| 7,112,356 B2 | 9/2006 | Nomula et al. |
| 7,128,969 B2 | 10/2006 | Busch et al. |
| 7,173,080 B2 | 2/2007 | Yamada et al. |
| 7,175,917 B2 | 2/2007 | Sukigara et al. |
| 7,195,822 B2 | 3/2007 | Hiruma |
| 7,214,414 B2 | 5/2007 | Khemani et al. |
| 7,223,359 B2 | 5/2007 | Torkelson et al. |
| 7,235,287 B2 | 6/2007 | Egawa |
| 7,285,318 B2 | 10/2007 | Kaku et al. |
| 7,316,848 B2 | 1/2008 | Longmoore |
| 7,320,773 B2 | 1/2008 | Egawa |
| 7,351,772 B2 | 4/2008 | Yano et al. |
| 7,351,785 B2 | 4/2008 | Matsumoto et al. |
| 7,354,973 B2 | 4/2008 | Flexman |
| 7,368,160 B2 | 5/2008 | Inglis |
| 7,368,496 B2 | 5/2008 | Kim et al. |
| 7,390,543 B2 | 6/2008 | Itoh et al. |
| 7,390,558 B2 | 6/2008 | Aritake et al. |
| 7,449,510 B2 | 11/2008 | Ueda et al. |
| 7,452,927 B2 | 11/2008 | Hayes |
| 7,501,176 B2 | 3/2009 | Yamasaki et al. |
| 7,521,103 B2 * | 4/2009 | Posey ............ 428/36.6 |
| 7,566,753 B2 | 7/2009 | Randall et al. |
| 7,619,025 B2 | 11/2009 | Mohanty et al. |
| 7,678,444 B2 | 3/2010 | Tedford, Jr. et al. |
| 7,713,636 B2 | 5/2010 | Song et al. |
| 7,714,048 B2 | 5/2010 | Goino et al. |
| 7,799,399 B2 | 9/2010 | Sargeant et al. |
| 7,820,276 B2 | 10/2010 | Sukigara et al. |
| 7,847,184 B2 | 12/2010 | Hayes et al. |
| 7,854,994 B2 | 12/2010 | Henderson-Rutgers et al. |
| 7,943,218 B2 | 5/2011 | Knoerzer et al. |
| 7,951,438 B2 | 5/2011 | Lee et al. |
| 7,993,745 B2 | 8/2011 | Narita et al. |
| 8,003,731 B2 | 8/2011 | Seeliger et al. |
| 8,043,674 B2 | 10/2011 | Rehkugler et al. |
| 8,053,219 B2 | 11/2011 | Kang et al. |
| 8,062,721 B2 | 11/2011 | Kawahara et al. |
| 8,252,421 B2 | 8/2012 | Arai et al. |
| 2001/0031348 A1 | 10/2001 | Jud et al. |
| 2002/0028857 A1 | 3/2002 | Holy |
| 2002/0076554 A1 | 6/2002 | Stopper |
| 2002/0086940 A1 | 7/2002 | Ota et al. |
| 2002/0094444 A1 | 7/2002 | Nakata et al. |
| 2003/0039775 A1 | 2/2003 | Kong |
| 2003/0175545 A1 | 9/2003 | Kastner et al. |
| 2003/0199218 A1 | 10/2003 | Mueller et al. |
| 2004/0053064 A1 | 3/2004 | Masuda et al. |
| 2004/0096677 A1 | 5/2004 | Imai et al. |
| 2004/0185282 A1 | 9/2004 | Rosenbaum et al. |
| 2004/0191541 A1 | 9/2004 | Squier et al. |
| 2004/0258857 A1 | 12/2004 | Dagan et al. |
| 2005/0098928 A1 | 5/2005 | Rosenbaum et al. |
| 2005/0131120 A1 | 6/2005 | Flexman |
| 2005/0186414 A1 | 8/2005 | Su et al. |
| 2005/0287358 A1 | 12/2005 | Inglis |
| 2006/0009611 A1 | 1/2006 | Hayes |
| 2006/0019111 A1 | 1/2006 | Sawai et al. |
| 2006/0068200 A1 | 3/2006 | Cleckner et al. |
| 2006/0116471 A1 * | 6/2006 | Aoyama et al. ............ 525/60 |
| 2006/0135668 A1 | 6/2006 | Hayes |
| 2006/0257585 A1 | 11/2006 | Schiller et al. |
| 2006/0257676 A1 | 11/2006 | Itada et al. |
| 2006/0269755 A1 | 11/2006 | Song |
| 2007/0020448 A1 | 1/2007 | Hubbard et al. |
| 2007/0032577 A1 | 2/2007 | Kanzawa et al. |
| 2007/0054070 A1 | 3/2007 | Laney et al. |
| 2007/0087131 A1 | 4/2007 | Hutchinson et al. |
| 2007/0098966 A1 | 5/2007 | Zhou |
| 2007/0141372 A1 | 6/2007 | Su et al. |
| 2007/0179218 A1 | 8/2007 | Brake et al. |
| 2007/0182041 A1 | 8/2007 | Rizk et al. |
| 2007/0254160 A1 | 11/2007 | Kravitz et al. |
| 2007/0259139 A1 | 11/2007 | Furneaux |
| 2008/0027178 A1 | 1/2008 | Uradnisheck |
| 2008/0160327 A1 | 7/2008 | Knoerzer et al. |
| 2008/0188154 A1 | 8/2008 | Leis et al. |
| 2008/0311813 A1 | 12/2008 | Ting et al. |
| 2009/0022919 A1 * | 1/2009 | Chicarella et al. ............ 428/35.9 |
| 2009/0053489 A1 | 2/2009 | Yamamura et al. |
| 2009/0098375 A1 | 4/2009 | Voisin et al. |
| 2009/0148713 A1 | 6/2009 | Lee et al. |
| 2009/0148715 A1 | 6/2009 | Lee |
| 2009/0169844 A1 | 7/2009 | Yamamura et al. |
| 2009/0171065 A1 | 7/2009 | Nakamura et al. |
| 2009/0263600 A1 | 10/2009 | Miyashita et al. |
| 2009/0263654 A1 | 10/2009 | Arai et al. |
| 2009/0286090 A1 | 11/2009 | Ting et al. |
| 2009/0311544 A1 | 12/2009 | Lee et al. |
| 2009/0312462 A1 | 12/2009 | Oakley et al. |

(56) References Cited

U.S. PATENT DOCUMENTS

| | | | |
|---|---|---|---|
| 2010/0009208 A1 | 1/2010 | Lee | |
| 2010/0040904 A1 | 2/2010 | Cloutier et al. | |
| 2010/0092791 A1 | 4/2010 | Busch et al. | |
| 2010/0151167 A1 | 6/2010 | Gohil | |
| 2010/0247886 A1 | 9/2010 | Lee et al. | |
| 2011/0028622 A1 | 2/2011 | Uradnisheck | |
| 2011/0046254 A1 | 2/2011 | Shin et al. | |
| 2011/0052867 A1 | 3/2011 | Yamamura et al. | |
| 2011/0171489 A1* | 7/2011 | Dou et al. | 428/623 |
| 2011/0244185 A1 | 10/2011 | Dou et al. | |
| 2011/0244186 A1 | 10/2011 | Dou et al. | |
| 2011/0244257 A1 | 10/2011 | Paulino et al. | |
| 2012/0088108 A1 | 4/2012 | Paolilli et al. | |
| 2012/0141766 A1 | 6/2012 | Paulino et al. | |
| 2013/0143057 A1* | 6/2013 | Paolilli et al. | 428/544 |

FOREIGN PATENT DOCUMENTS

| | | |
|---|---|---|
| EP | 1 385 700 | 2/2004 |
| EP | 1 385 899 | 2/2004 |
| EP | 1 385 700 | 7/2005 |
| EP | 1 385 899 | 2/2007 |
| EP | 1 839 849 | 10/2007 |
| EP | 1 942 001 | 7/2008 |
| EP | 1 955 845 | 8/2008 |
| EP | 2 065 178 | 6/2009 |
| EP | 2065178 | 6/2009 |
| EP | 2 133 382 | 12/2009 |
| JP | 8-176329 | 7/1996 |
| JP | 2003-145677 | 5/2003 |
| JP | 2003-276144 | 9/2003 |
| JP | 2004-82512 | 3/2004 |
| JP | 2004-315586 | 11/2004 |
| JP | 2004-323592 | 11/2004 |
| JP | 2004-358721 | 12/2004 |
| JP | 2006-176758 * | 7/2006 |
| JP | 2006-263892 | 10/2006 |
| JP | 2007-269995 | 10/2007 |
| JP | 2008-62591 | 3/2008 |
| JP | 2008-62984 | 3/2008 |
| KR | 10-2006-0099887 | 9/2006 |
| KR | 10-2007-0102005 | 10/2007 |
| WO | WO-94/17220 | 8/1994 |
| WO | WO-02/087877 | 11/2002 |
| WO | WO-02/088230 | 11/2002 |
| WO | WO-2004/016417 | 2/2004 |
| WO | WO-2004/060648 | 7/2004 |
| WO | WO-2004/087812 | 10/2004 |
| WO | WO-2004/094143 | 11/2004 |
| WO | WO-2004/101642 | 11/2004 |
| WO | WO-2005/059031 | 6/2005 |
| WO | WO-2007/046174 | 4/2007 |
| WO | WO-2007/118280 | 10/2007 |
| WO | WO-2008/020726 | 2/2008 |
| WO | WO-2008/035557 | 3/2008 |
| WO | WO-2009/076458 | 6/2009 |
| WO | WO-2009/076541 | 6/2009 |
| WO | WO-2009/084518 | 7/2009 |
| WO | WO-2009/142825 | 11/2009 |
| WO | WO-2009/152427 | 12/2009 |
| WO | WO-2010/019944 | 2/2010 |

OTHER PUBLICATIONS

Lee et al., Office Action mailed Sep. 20, 2012, directed to U.S. Appl. No. 12/731,925; 18 pages.

Lee et al., Office Action mailed Jun. 4, 2013, directed to U.S. Appl. No. 12/731,925; 18 pages.

Dou, S. et al., U.S. Appl. No. 13/077,302, filed Mar. 31, 2011; 65 pages.

Cloutier et al., U.S. Office Action mailed Oct. 27, 2011, directed to U.S. Appl. No. 12/542,428; 13 pgs.

Dou et al., U.S. Office Action mailed Sep. 7, 2012, directed to U.S. Appl. No. 13/077,302.

Paolilli, U.S. Office Action mailed Jan. 16, 2013, directed to U.S. Appl. No. 12/890,349.

Extended Search Report dated Nov. 6, 2012, directed to EP Application No. 08859113.6; 6 pages.

Paulino et al., U.S. Office Action mailed Dec. 26, 2012, directed to U.S. Appl. No. 13/107,149; 15 pages.

Dou et al., U.S. Office Action mailed Jan. 18, 2013, directed to U.S. Appl. No. 12/814,802; 15 pages.

Dou et al., U.S. Office Action mailed Jan. 22, 2013, directed to U.S. Appl. No. 12/824,759; 9 pages.

Dou et al., U.S. Office Action mailed Apr. 24, 2013, directed to U.S. Appl. No. 13/030,392; 12 pages.

Dou et al., U.S. Office Action mailed Dec. 12, 2012, directed to U.S. Appl. No. 12/977,647; 12 pages.

Dou et al., U.S. Office Action mailed Feb. 14, 2013, directed to U.S. Appl. No. 13/077,302; 13 pages.

TAPPI Conference Presentation, May 2003, "Adhesive Properties of Ethylene-Acrylic Ester-Maleic Anhydride Terpolymers in Extrusion Coating/Lamination"; (27 pages).

Product Literature Presentation, May 2005, "Lotader: Ultra Versatile Adhesives for Extrusion Coating and Extrusion Lamination Technologies"; (18 pages).

Jiang, et al., (Nov. 23, 2005). "Study of Biodegradable Polylactide/Poly(butylene adipate-co-terephthalate) Blends," Biomacromolecules. 7(1):199-207.

Biofilm S.A. "Prospect on PLA applications: Clear Barrier Technology" promotional literature presented at "Innovation Takes Root" by Nature Works, Las Vegas NV. Sep. 16-18, 2008; 16 pages.

(2007) "Technology Focus Report: Toughened PLA," NatureWorks 1-5.

Priddy, D. (2010) "Improving PLA mechanical properties by the addition of oil," Polymer Engineering and Science 50(3): 513-519.

International Search Report and Written Opinion mailed on Feb. 6, 2009, directed to counterpart international Application No. PCT/US2008/86261; 8 pages.

International Search Report and Written Opinion mailed on Feb. 6, 2009, directed to counterpart International Patent Application No. PCT/US2008/86450; 5 pages.

International Search Report and Written Opinion, mailed Aug. 17, 2011, directed to International Patent Application No. PCT/US11/36453; 11 pages.

International Search Report mailed on Oct. 1, 2009 directed at international application No. PCT/US2009/054022; 12 pages.

International Search Report and Written Opinion mailed on Aug. 17, 2010, directed to counterpart International Patent Application No. PCT/US10/38848; 11 pages.

International Search Report and Written Opinion mailed on Sep. 1, 2010, directed to counterpart International Patent Application No. PCT/US2010/040185; 10 pages.

International Search Report and Written Opinion mailed Feb. 11, 2011, directed to International Patent Application No. PCT/US10/50227; 10 pages.

International Search Report and Written Opinion mailed Jun. 3, 2011, directed to International Patent Application No. PCT/US11/25466; 9 pages.

International Search Report and Written Opinion mailed Mar. 14, 2011, directed to International Patent Application No. PCT/US10/62062; 10 pages.

International Search Report and Written Opinion mailed May 26, 2011, directed to International Patent Application No. PCT/US11/30784; 9 pages.

Lee et al., U.S. Office Action mailed Jun. 25, 2009, directed to U.S. Appl. No. 12/332,153; 9 pages.

Lee et al., U.S. Office Action mailed on Dec. 23, 2009, directed at U.S. Appl. No. 12/332,153; 10 pages.

Lee et al., U.S. Office Action mailed on Apr. 12, 2010, directed at U.S. Appl. No. 12/332,153; 11 pages.

Lee et al., U.S. Office Action mailed on Sep. 28, 2010, directed at U.S. Appl. No. 12/332,153; 9 pages.

Lee, U.S. Office Action mailed Sep. 27, 2011, directed to U.S. Appl. No. 12/333,047; 7 pages.

Lee, U.S. Office Action mailed May 25, 2012, directed to U.S. Appl. No. 12/333,047; 9 pages.

(56) References Cited

OTHER PUBLICATIONS

Cloutier et al., U.S. Office Action mailed Oct. 27, 2011, directed to U.S. Appl. No. 12/542,428; 13 pages.

Cloutier et al., U.S. Office Action mailed Jul. 6, 2012, directed to U.S. Appl. No. 12/542,428; 10 pages.

Dou et al., U.S. Office Action mailed Aug. 7, 2012, directed to U.S. Appl. No. 12/814,802; 19 pages.

Dou et al., U.S. Office Action mailed Aug. 20, 2012, directed to U.S. Appl. No. 12/824,759; 12 pages.

Paolilli, U.S. Office Action mailed Jan. 16, 2013, directed to U.S. Appl. No. 12/890,349; 11 pages.

Dou, et al., U.S. Office Action mailed Jun. 29, 2012, directed to U.S. Appl. No. 12/977,647;21 pages.

Dou et al., U.S. Office Action mailed Sep. 7, 2012, directed to U.S. Appl. No. 13/077,302; 12 pages.

Shichen Dou et al., U.S. Appl. No. 12/814,802, filed Jun. 14, 2010; 35 pages.

Shichen Dou et al., U.S. Appl. No. 12/824,759, filed Jun. 28, 2010; 30 pages.

Shiche Dou et al. U.S. Appl. No. 13/030,392, filed Feb. 18, 2011; 63 pages.

Shichen Dou et al., U.S. Appl. No. 12/977,647, filed Dec. 23, 2010; 59 pages.

Shichen Dou et al., U.S. Appl. No. 13/077,302, filed Mar. 31, 2011; 65 pages.

Shichin Dou et al., U.S. Appl. No. 61/218,846, filed Jun. 19, 2009; 13 pages.

Defosse, Matt. "Film extrusion: Bioplastic barrier film matches EVOH, PA," located at <http://www.plasticstoday.com/print/31263> visited on Nov. 20, 2009. (1 page).

"Coextruded Film Structures of PLA and EVOH," presented at Tappi Place Conference, Albuquerque, New Mexico, Apr. 18-21, 2010; 31 pages.

Wallach, J. et al., "Methacrylic Group Functionalized Poly(lactic acid) Macromonomers from Chemical Recycling of Poly(lactic acid)." *Polymers from Renewable Resources,* ACS Symposium Series [online]. Jan. 15, 2001, Chapter 18, pp. 281-292; Retrieved from the Internet: URL:http://pubs.acs.org/doi/abs/10.1021/bk-2000-0764.ch018, Abstract only.

Markarian, Jennifer. (May/Jun. 2008). "Biopolymers present new market opportunities for additives in packaging," *Plastics, Additives, and Compounding* 10(3): 22-25.

Paulino et al., U.S. Office Action mailed Aug. 5, 2013, directed to U.S. Appl. No. 13/107,149; 20 pages.

Paolilli et al., U.S. Office Action mailed Jul. 17, 2013, directed to U.S. Appl. No. 12/890,349; 12 pages.

Paolilli et al., U.S. Office Action mailed Sep. 3, 2013, directed to U.S. Appl. No. 13/754,476; 8 pages.

Dou et al., U.S. Office Action mailed Sep. 24, 2013, directed to U.S. Appl. No. 13/030,392; 9 pages.

Paulino et al., U.S. Office Action mailed May 22, 2013, directed to U.S. Appl. No. 13/313,567; 9 pages.

Paulino et al., U.S. Office Action mailed Oct. 16, 2013, directed to U.S. Appl. No. 13/313,567; 8 pages.

Paulino et al., U.S. Office Action mailed Feb. 26, 2014, directed to U.S. Appl. No. 13/313,567; 15 pages.

Extended Search Report dated Nov. 14, 2012, directed to EP Application No. 08860690.0; 6 pages.

Cloutier et al., U.S. Office Action mailed Nov. 22, 2013, directed to U.S. Appl. No. 12/542,428; 10 pages.

Extended Search Report dated Nov. 21, 2012, directed to EP Application No. 09807412.3; 6 pages.

International Search Report and Written Opinion mailed May 7, 2010, directed to International Application No. PCT/US10/028685; 8 pages.

Extended Search Report dated May 3, 2013, directed to EP Application No. 10756851.1; 5 pages.

Canadian Office Action mailed Apr. 16, 2013, directed to CA Application 2,766,816; 2 pages.

\* cited by examiner

MULTI-LAYER HIGH MOISTURE BARRIER POLYLACTIC ACID FILM

CROSS-REFERENCE TO RELATED APPLICATION

This application is a divisional application of U.S. patent application Ser. No. 12/890,349, filed Sep. 24, 2010, which claims the benefit of U.S. Provisional Application Ser. No. 61/246,048, filed Sep. 25, 2009, the entire content of which is incorporated herein by reference.

FIELD OF INVENTION

This invention relates to a multi-layer biaxially oriented polylactic acid (BOPLA) film in-line or off-line coated with various aqueous coatings to provide improved moisture barrier properties.

BACKGROUND OF INVENTION

Biaxially oriented polypropylene films are typically used for packaging, decorative, and label applications and often perform multiple functions. In a lamination, they provide printability, transparent or matte appearance, or slip properties. The films sometimes provide a surface suitable for receiving organic or inorganic coatings for gas and moisture barrier properties. The films sometimes provide a heat sealable layer for bag forming and sealing, or a layer that is suitable for receiving an adhesive either by coating or by laminating.

However, in recent years, interest in "greener" packaging has been strongly developing. Interest in packaging materials based on biologically derived polymers is increasing due to concerns with non-renewable resources, waste production, raw materials, and the production of greenhouse gases. Biodegradable polymers help alleviate the growing environmental problem of the production of an excessive amount of plastic waste. Non-biodegradable plastic waste requires years to decompose and includes an ever increasing volume fraction of the waste present in landfills. Also, it is believed that bio-based polymers, once fully scaled up, will help reduce reliance on petroleum and thereby reduce the production of greenhouse gases due in part to their sustainably-sourced feedstocks (i.e. plant-sourced).

Bio-based polymers such as polylactic acid, which is derived from corn starch and thus can be considered to be derived from a renewable resource, is one of the more popular and commercially available materials available for packaging film applications. However, due to the commercial expenses compared to traditional polymers and the difficulties that can arise in the processing of these bio-polymers to form a product comparable to or matching that of existing products, there has been little commercial success. Many compositions involving these polymers exhibit limited quality, processability, degradability, or some combination thereof.

For such a bio-based polymer to be fit-for-use for many snack food packaging applications, it is desirable that the bio-based polymer film match as many of the attributes as possible, and therefore exhibit the level of quality and performance, that BOPP is well-known for such as heat sealability, printability, controlled COF, metallizability, barrier, etc. In particular, for high barrier packaging, metallized oriented PLA films should demonstrate good oxygen and moisture barrier properties. For metallized oriented PLA in particular, high oxygen barrier property is generally easily achieved due to the polar nature of PLA, which provides good hydrogen-bonding of the polymer molecules. However, this polar nature tends to be detrimental for achieving high moisture barrier. Without being bound by any theory, the thought is that water molecules—being polar—may more easily migrate through a polar polymer film than a non-polar polymer film. In order to achieve a useful protection of snack food products from staleness and/or rancidity, and to ensure a reasonably adequate shelf-life, it is preferable to have a moisture barrier property of at least about 1.0 g/m$^2$/day or better, and more preferably, to have a moisture barrier property of about 0.50 g/m$^2$/day or better, at 38° C. and 90% RH. It is preferable to have an oxygen barrier of at least about 46.5 cc/m$^2$/day, and more preferably 31 cc/m$^2$/day or better, at 23° C. and 0% RH.

Many products currently on the market at the time of this writing do not provide satisfactory moisture barrier properties. For example, Celplast Metallized Products, Ltd.'s Enviromet™ high barrier metallized PLA film data sheet describes a product that exhibits an excellent oxygen barrier of 6.2 cc/m$^2$/day (at 23° C., 50% relative humidity or RH) but a relatively poor moisture barrier of 3.1 g/m$^2$/day (at 38° C., 90% RH) as compared to typical metallized biaxially oriented polypropylene films. (High barrier metallized BOPP such as Toray Plastics (America), Inc.'s PWX3 product typically demonstrates oxygen barrier of 15.5 cc/m$^2$/day (23° C., 0% RH) and moisture barrier of 0.155 g/m$^2$/day (38° C., 90% RH)). Another manufacturer of barrier PLA film, Alcan Packaging Inc., produces a silicon oxide coated PLA film under the tradename Ceramis® whose data sheet shows an oxygen barrier of 7.75 cc/m$^2$/day (23° C., 50% RH) and moisture barrier of 7.75 g/m$^2$/day (38° C., 90% RH). Biofilm S.A. promotional literature (such as presented at the "Innovation Takes Root" conference hosted by NatureWorks LLC at Las Vegas, Nev. Sep. 16-18, 2008) discusses transparent barrier PLA films demonstrating moisture barrier of 3-10 g/m$^2$/day (38° C./90% RH) using various vacuum chamber deposition processes.

While one could employ traditional polymers, such as polypropylene or polyethylene, that exhibit good moisture barrier properties as an outer layer to improve the effectiveness of this barrier and thereby the quality of the product, such an incorporation would impact degradability. To retain degradability and quality, any other components must be degradable and commercially reasonable.

U.S. Pat. No. 5,153,074 describes the use of an extrusion-grade EVOH of typically 48% wt ethylene content coextruded with a maleic anhydride grafted propylene homopolymer or copolymer and biaxially oriented into a film. This film is then metallized on the EVOH surface for high barrier properties. However, such a formulation cannot be used in a coating process due to high ethylene content EVOH which cannot be dissolved in water. Nor is a biopolymer substrate such as PLA contemplated. In addition, the high ethylene content of the EVOH used prevents such a material from being biodegradable or compostable.

U.S. Pat. No. 5,175,054 describes the use of in-line coating between the MDO and TDO, a PVOH dispersion blended with a metal-containing ionic copolymer onto a biaxially oriented polymer substrate. The ionic copolymer acts as a tie-layer resin or primer to enable good adherence of the PVOH to the polyolefin substrate. This in-line coated film is then metallized via vacuum deposition on the PVOH blend surface. However, this reference is not a biopolymer-based substrate and would not exhibit biodegradable or compostable properties.

U.S. Pat. No. 4,464,438 describes the blend of PVOH and EVOH with a processing aid to enable extruding and stretching such a blend into a film. However, these blends were not co-extruded or coated onto a BOPP substrate, nor is a biopolymer-based substrate contemplated.

U.S. Pat. No. 5,731,093 describes the use of in-line coating between the MDO and TDO, a PVOH blend with polyvinylidene chloride (PVdC) onto a multilayer biaxially oriented polypropylene film substrate. The PVOH blend with PVdC surface is then metallized via a vacuum deposition process. Excellent barrier properties are obtained, but the use of PVdC raises environmental concerns. Moreover, the polypropylene substrate would not be biodegradable.

U.S. Pat. No. 5,473,439 describes the use of crosslinked EVOH coatings on biaxially oriented polypropylene or polyethylene substrates. However, there is no indication of the efficacy of such coatings on PLA substrates or the use of combining EVOH with PVOH and crosslinking this blend. In addition, these pololefin substrates would not be biodegradable.

U.S. patent application Ser. No. 12/332,153 describes coextrusions of polyolefin metal receiving layers on a PLA core layer to improve moisture barrier properties after metallization. However, no coatings are contemplated to be applied directly to the PLA substrate.

PCT application PCT/US2009/54022 describes the improvement of moisture barrier properties on metallized PLA substrates via a unique process of sputter-deposited copper or other metal "seeding" or "priming" of the PLA substrate prior to aluminum vapor deposition. However, this process is not contemplated on a coating applied to the PLA substrate. This reference is incorporated in its entirety in this application.

SUMMARY OF THE INVENTION

We seek to address the above issues of improving gas barrier properties of biaxially oriented polylactic acid-based films, particularly for moisture vapor barrier. The inventors have found a solution that utilizes various coating formulations such as vinyl alcohols, vinyl alcohol-vinylamine copolymers, anionic carboxylated styrene-butadiene copolymer, and blends thereof. Of particular interest, is a coating that utilizes a blend of EVOH, PVOH, and crosslinking agent which enables this formulation to be in-line coated between the MDO and TDO of a sequential orientation line or off-line coated on an already oriented film. This coating formulation is uniquely suited to work well with in-line coating processes to provide excellent barrier properties, excellent metal adhesion when metallized by vacuum deposition, good stretching in the transverse orientation process without attendant and disadvantageous cracking problems, and utilization of EVOH with very low ethylene content such that gas barrier properties are optimized. The crosslinked PVOH and EVOH also contributes to excellent gas barrier and metal adhesion, is expected to retain good barrier properties even in humid conditions, and can be applied both in-line and off-line to the polylactic acid (PLA) substrate.

One embodiment is a laminate film including a polar polymer blend such as a crosslinked low ethylene content EVOH and a crosslinked polyvinyl alcohol copolymer (PVOH) layer on a first biaxially oriented polylactic acid resin-containing layer. The crosslinked EVOH/PVOH blend is preferably applied to the polylactic acid resin-containing layer by means of an aqueous solution of said blend coated in-line to the polylactic acid layer during the biaxial orientation process, preferably between the machine direction orientation process (MDO) and the transverse orientation process (TDO). It can also be contemplated to apply this to a simultaneous orientation process in which the coating is applied in-line between the casting unit and the simultaneous stretching oven. By this means, the width of the in-line coater can be maintained at a reasonable width (e.g., the width of the machine-direction oriented sheet) and capital cost, and the tenter oven can be used as a drying oven to remove the water from the aqueous solution and whose elevated temperature can help drive and complete the crosslinking of the vinyl alcohol portions of the coating blend. A suitable crosslinking agent is added to enable crosslinking of the PVOH and EVOH prior to either in-line or out-of-line coating, preferably in a batch tank or tote that supplies coater. In this way, the EVOH/PVOH blend will not prematurely crosslink prior to use while in storage. Additionally, optional defoamers may be added to the PVOH/EVOH blend to help reduce foam generation during the coating process. Optional anti-microbial agents may be added to the coating solution as well in order to inhibit bacterial or mold growth to enable long-term storage and shelf-stability prior to use.

The dried and oriented crosslinked EVOH/PVOH polymer-containing layer is directly on the first polylactic acid resin-containing layer. Said first polylactic acid resin-containing layer can optionally include a tie-layer or adhesion-promoting material to improve further adhesion of the coating to the PLA substrate. The laminate further includes a second polylactic acid resin-containing layer on the side of the first polylactic acid resin-containing layer opposite the coating receiving side. This second polylactic acid resin-containing layer could be considered a core layer to provide the bulk strength of the laminate film. Furthermore, the laminate could further include a third polylactic acid resin-containing layer on the second polylactic acid resin-containing core layer opposite the side with the first PLA resin-containing coating receiving layer.

The first polylactic acid resin-containing layer includes crystalline PLA, amorphous PLA, or a blend of crystalline and amorphous PLA, which provides good adhesion with the polar crosslinked EVOH/PVOH polymer layer. In another variation of the first polylactic acid resin-containing layer, it can also include other optional ingredients such as an amount of ethylene-acrylate copolymer that can act as a processing aid to enable high transverse orientation rates of up to 8-11×, particularly if this layer includes a majority amount of crystalline PLA. Without such a processing aid, transverse orientation rates of a highly crystalline PLA layer would be on the order of 3-5×. The first PLA layer may also include an amount of amorphous PLA blended with the crystalline PLA as well as the optional ethylene-methacrylate copolymer. Another embodiment is that the first PLA-containing layer may also be substantially 100 wt % amorphous PLA as this composition can provide improved coating adhesion compared to a layer of substantially crystalline PLA. The first PLA-based resin layer can also include various additives such as antiblock particles to allow for easier film handling. Non-migratory antiblocks are preferred over migratory slip agents such as fatty amides or silicone oils. Additionally, this first polylactic acid-containing resin layer may also be discharge treated in-line after machine direction orientation, but prior to in-line solution coating to aid in wet-out of the coating onto the substrate. Similarly, for an off-line coating application, it is preferable to discharge-treat the coating-receiving layer prior to coating.

Preferably, the second polylactic-acid resin-containing layer includes a blend of amorphous and crystalline polylactic acid. Preferably, this core PLA resin-containing layer includes a crystalline polylactic acid homopolymer of about 90-100 wt % L-lactic acid units (or 0-10 wt % D-lactic acid units). An optional amount of amorphous PLA may also be blended in with the crystalline PLA from 0-48 wt % of the core layer. The amorphous PLA is also based on L-lactic acid units but has greater than 10 wt % D-lactic acid units and/or meso-lactide units (which includes one each of L and D lactic acid residuals). A preferred amount of amorphous PLA to be blended with the crystalline PLA is about 15 wt % of the first layer. An optional amount of an ethylene-acrylate copolymer component of the first layer formulation can be used in the amount from about 2-10 wt % of the core layer, particularly if it is desired to make this film by a biaxial orientation process in which transverse orientation could be greater than about 5 times. It is also contemplated to add to the core layer antiblock particles of suitable size, selected from the amorphous silicas, aluminosilicates, sodium calcium aluminum silicates, crosslinked silicone polymers, and polymethylmethacrylates to aid in machinability and winding, particularly if this core layer is part of only a mono-layer film design or a 2-layer coextruded film design. Suitable amounts of antiblock range from 0.03-0.5% by weight of the core layer and typical particle sizes of 2.0-6.0 µm in diameter.

Preferably, the third polylactic acid resin-containing layer includes a heat sealable PLA resin-containing layer including an amorphous PLA of greater than 10 wt % D-lactic acid units. It is not necessary to use any of the impact modifier/process aid ethylene-acrylate copolymer in this case, as the amorphous PLA can be oriented relatively easily at high TD orientation rates. This coextruded heat sealable amorphous PLA resin-containing layer can also include an antiblock component selected from amorphous silicas, aluminosilicates, sodium calcium aluminum silicates, crosslinked silicone polymers, and polymethylmethacrylates to aid in machinability and winding and to lower coefficient of friction (COF) properties. Suitable amounts range from 0.03-0.5% by weight of the core layer and typical particle sizes of 2.0-6.0 µm in diameter, depending on the final thickness of this layer. Migratory slip additives may also be contemplated to control COF properties such as fatty amides (e.g. erucamide, stearamide, oleamide, etc.) or silicone oils ranging from low molecular weight oils to ultra high molecular weight gels. Suitable amounts of slip additives to use can range from 300 ppm to 10,000 ppm of the layer.

Generally, however, where the above embodiments are to be used as a substrate for vacuum deposition metallizing, it is recommended that migratory slip additives not be used as these types of materials may adversely affect the metal adhesion or metallized gas barrier properties of the metallized BOPLA film. It is thought that as the hot metal vapor condenses on the film substrate, such fatty amides or silicone oils on the surface of the film could vaporize and cause pin-holing of the metal-deposited layer, thus compromising gas barrier properties. Thus, only non-migratory antiblock materials should be used to control COF and web-handling.

Further preferably, the substrate film is produced via extrusion of the first PLA layer (or coextruded with other PLA-containing polymeric layers as desired) through a compositing die whereupon the molten film is quenched upon a chilled casting roll system or casting roll and water bath system and subsequently oriented in the machine and/or transverse direction into a biaxially oriented film. Machine direction orientation rate is typically 2.0-3.0× and transverse direction orientation is typically 3.0-5.0×. With the use of the ethylene-acrylate impact modifier process aid in the core layer, transverse direction orientation can be increased to typically 8.0-11.0×. Heat setting conditions in the TDO oven is also critical to minimize thermal shrinkage effects. The film is wound into a roll form.

A layer of a coating of the inventive formulations is applied contiguously upon at least one of the surfaces of the substrate layer. The method of applying this coating layer to the substrate layer can be of various means well known in the art, such as solution coating an aqueous solution of the blend (which may include an amount of crosslinker, if needed) onto the substrate layer by means of a coating roll (e.g. gravure roll or Meyer rod) or other coating means, and drying of the coating. In particular, a cost-effective method of applying the polar polymer blend solution is by means of a gravure coating roll via an in-line coating method whereby the coating station is placed "in-line" with the film-making line. In this configuration, the coating station is placed between the machine direction orientation section and the transverse direction orientation section of a sequential biaxial orientation line. Thus, the coating solution is applied on the coating-receiving layer surface of the substrate after machine direction orientation of the substrate but before the transverse direction orientation of the substrate. The transverse direction orientation section's preheat ovens effectively act as a drier to remove the solvent, leaving the dried coating polymer adhered to the substrate. Additionally, the transverse direction oven temperatures may help accelerate the crosslinking of the polymer portion of the dried solution. The coated substrate is stretched in the transverse direction, thus completing the biaxial orientation process. In the case of a simultaneous biaxial orientation process which does not have a separate machine direction orientation section, the in-line coating station can be placed between the casting section and the orientation oven.

Alternatively, the inventive coatings of interest may be applied in an off-line gravure or metering rod coater. In this case, a BOPLA substrate film can be made as described above—without the in-line coating steps—and wound into roll form. This uncoated film can then be processed in a separate off-line coater where the coating can be applied in various ways known in the art via gravure roll or metering rod, preferably gravure. Alternatively, biaxially oriented PLA film can be obtained commercially from Bi-Ax International Inc. under the tradename Evion®. These coatings are applied to the desired coating-receiving side of the film—which may be discharge-treated or not, but preferably discharge-treated to a dyne level of at least 38 dynes/cm—dried in an air flotation oven and wound back up into roll form.

Viable coatings include PVOH, EVOH, a blend of crosslinked EVOH/PVOH, vinyl alcohol-vinylamine (PVAm) copolymer, anionic carboxylated styrene-butadiene copolymer (SBR) emulsion, or blends thereof.

Preferably, the chosen coating is a discharge-treated polar polymer resin-containing layer that is coated onto the first layer of crystalline PLA via in-line coating. In one variation, the discharge-treating of the coating layer occurs after transverse orientation and drying of this coating. This discharge-treated resin-containing layer has a discharge-treated surface formed in an atmosphere of $CO_2$ and $N_2$. Other discharge-treatments can also be used such as electrical corona in air, flame, or other discharge-treatment methods using a controlled atmosphere or blend of gases.

Optionally, an additional layer of a heat-sealable surface or a winding surface containing antiblock and/or slip additives for good machinability and low coefficient of friction (COF) can be disposed opposite the side with the coating layer. Furthermore, if this additional layer is used as a winding surface, its surface may also be modified with a discharge treatment to make it suitable for laminating or converter applied adhesives and inks.

The aforementioned film roll is then be placed within a vacuum metallization chamber in which high-speed vapor deposition of metal upon the exposed surface of the coated layer takes place, preferably with aluminum, by metallizing processes which are well-known in the art. Typical optical density of the aluminum is 1.5-5.0, preferably 2.2-3.2. Optionally, a "primer" layer of a different metal may be sputter-deposited in-chamber prior to the aluminum vapor deposition. Such a "primer" layer of metal ions can improve subsequent aluminum nucleation and adhesion to the substrate, resulting in better and more consistent gas barrier properties. A preferred "primer" metal can be copper.

Another embodiment is a method for flexible packaging including obtaining a laminate film including a coating-containing layer on the first PLA resin-containing layer and surrounding a product by the laminate film. Preferably, the product is a food product.

In yet another embodiment, this invention provides biaxially oriented PLA multi-layer films with a skin layer of polar crosslinked EVOH/PVOH polymer, or another of the viable coating alternatives, to enhance barrier properties for flexible packaging purposes. An additional embodiment provides laminate structures of PLA layers and coating layers for barrier applications in flexible packaging.

This invention provides a method to improve the barrier of biaxially oriented films and metallized films resulting in a high barrier packaging film with excellent gas barrier properties. The invention provides a method to produce film with a metallized coating, resulting in improved moisture vapor and oxygen barrier properties.

The laminate film of the invention includes at least a 2-layer laminate film wherein the first layer is an oriented film formed substantially of PLA, either monoaxially or biaxially, the preferred being biaxially oriented. The second layer is includes one of the inventive coatings and is contiguously attached to one surface of the first PLA layer.

All these embodiments can also be metallized via vapor-deposition, preferably with the aforementioned vapor-deposited aluminum layer.

Additional advantages of this invention will become readily apparent to those skilled in the art from the following detailed description, wherein only the preferred embodiments of this invention are shown and described, simply by way of illustration of the best mode contemplated for carrying out this invention. As will be realized, this invention is capable of other and different embodiments, and its details are capable of modifications in various obvious respects, all without departing from the spirit of the invention. Accordingly, the drawings and description are to be regarded as illustrative in nature and not as restrictive.

DETAILED DESCRIPTION OF THE INVENTION

Figure 1:
FIG. 1 illustrates compostability testing (ASTM D6400) at week 9 of a 26 week test of a sample prepared according to Comparative Example 1.

Described are multi-layer biaxially oriented polylactic acid (BOPLA) films in-line or off-line coated with various aqueous coatings to provide improved moisture barrier properties. In particular, a blend of ethylene vinyl alcohol and polyvinyl alcohol aqueous solution and crosslinking and defoaming agents has been shown to be particularly effective in improving moisture barrier properties of BOPLA films. This coating formulation is particularly suited for in-line coating on a biaxial orientation film tenter line, with coating occurring prior to transverse orientation or off-line coating the formulation upon an already oriented film. This formulation is able to provide excellent gas barrier properties and metal adhesion when metallized via vacuum deposition.

It is desirable for the BOPLA to have high moisture vapor and oxygen barrier properties. Metallization of BOPLA via vacuum deposition of aluminum is a well-known, cost effective method to improve significantly the moisture and oxygen barrier properties of packaging films in general and also provides a light barrier to protect the food product wrapped by such a film. The inventors have found that gas barrier properties of BOPLA films, especially for moisture vapor, can be significantly improved by using coatings applied to a BOPLA substrate film such as polyethylene vinyl alcohol (EVOH), polyvinyl alcohol (PVOH), or polyhydroxyaminoether (PHAE), polyvinyl amines (PVAm), polyurethanes (PU), styrene butadiene rubbers (SBR), and blends thereof. These additional layers can also be metallized to improve greatly gas barrier properties and, surprisingly, moisture barrier properties, since these polar polymers are well-known for their oxygen-barrier properties rather than moisture barrier. Thus, this invention can be useful to food manufacturers in providing packages that can greatly extend their products' shelf-life and freshness while maintaining a package that is compostable and sustainable-sourced. In particular, blends of EVOH and PVOH with appropriate crosslinking agents have surprisingly been found to be very effective in improving moisture barrier properties of BOPLA films, especially after metallizing said coated films.

In order to develop an aqueous coating solution, EVOH grades of very low ethylene content should be selected (e.g. less than 10% wt ethylene content) in order for it to dissolve in water. Such low ethylene content EVOH provides excellent barrier properties. However, when used as an in-line coating during biaxial film orientation, upon transverse direction orientation, such EVOH also is prone to cracking, thereby causing poor barrier properties due to the highly crystalline nature of such a low ethylene content polymer. In addition, these very low ethylene content EVOH may be prone to poor metal adhesion due to cohesive failure of the EVOH layer. Without being bound by any theory, such very low ethylene content EVOH may have a Tg in excess of 60° C. and relatively low molecular weight of 80,000-130,000 g/mol. This may make the EVOH layer relatively brittle in comparison to polyolefin substrates (e.g. polypropylene Tg—10° C., MW ca. 350,000 g/mol) and more prone to cohesive failure when tested for metal adhesion. Higher ethylene content EVOH suitable for extrusion (e.g. 48 wt % ethylene) has a lower Tg and higher molecular weight which may not be as prone to cohesive failure and can offer stronger metal adhesion (however, such higher ethylene content EVOH are not water-soluble). Moreover, such high ethylene content EVOH polymers are likely unsuitable for degradation or compostability. Additionally, EVOH materials can be prone to barrier loss under humid conditions wherein the humidity can cause swelling and plasticization of the polymer. Crosslinking of the EVOH can help remedy this and improve the gas barrier properties under humid conditions.

Such limitations due to orientation are not an issue if one is extrusion coating or solution coating upon an already biaxially oriented film substrate. However, this is a more costly process as an extra manufacturing step is incurred with its associated additional capital, energy, and material yield losses. The manufacturer must take one production step to produce the biaxially oriented film, and then a second production step to coat said film. If the final film product can be made in one single production step—as coextrusion or in-line coating can offer—the final film product cost is much lower and can compete in the marketplace more effectively.

With PVOH materials, extrusion-grade versions are rare and if available, are still difficult to process and may degrade easily during extrusion. Aqueous coating grades are readily available however, and have been used in off-line coating processes with many film and paper substrates. Although PVOH can give good oxygen gas barrier properties, it is prone to a loss of barrier properties under humid conditions wherein the humidity can cause swelling and plasticization of the polymer as mentioned above with EVOH. One way to remedy this is to crosslink the PVOH; this restricts swelling and plasticization and improves the barrier properties of PVOH under humid conditions. However, this crosslinking could make the PVOH coating difficult to orient in an in-line coating process. If the PVOH is crosslinked to a high degree, the coating could fracture or crack under the orientation stresses, resulting in a loss of barrier properties. Moreover, it has been found that metallizing of the uncrosslinked PVOH can result in poor or low metal adhesion values which is undesirable. Without being bound by any theory, it is possible that the uncrosslinked PVOH layer may be prone to cohesive failure when tested for metal adhesion due to its high Tg (75-85° C.) and relatively low molecular weight (85,000-124,000 g/mol), making it brittle. When crosslinked, it effectively increases the "molecular weight" of the coating, making it a more durable and robust layer for improved cohesive strength which results in a stronger metal adhesion. Thus, it is desirable to crosslink both the EVOH and PVOH components of the coating on a BOPLA substrate.

Polyvinylidene chloride coatings (PVDC), provide both oxygen and moisture vapor barrier improvements when applied to film substrates; however, the current social climate with the environmental impacts of packaging have made the use of PVDC coatings in packaging structures unfavorable due to the potential generation of hazardous substances (e.g. HCl gas) when reprocessing or incinerating PVDC-containing materials.

Described are methods for achieving high moisture and oxygen barrier properties with polymer films while simultaneously incorporating sustainable, bio-based resin content, maintaining degradable properties, and maintaining a reasonable economical process. The inventors have found solutions whereby a multilayer film design incorporates various coating formulations, in particular a blend of PVOH and EVOH, including crosslinking agents. that is then coated with aluminum via vapor deposition metallization. This film structure provides improved moisture barrier properties, maintains a majority composition of bio-polymer in the total film construction (ca. 95 wt % or more), and is degradable under biodegradation or composting environmental conditions.

In one embodiment of the invention, the laminate film includes a multi-layer coextruded film of: 1) a heat sealable layer or a non-heat sealable winding layer coextruded onto one side of said core layer comprised preferably of amorphous PLA; 2) A coextruded core layer including a crystalline polylactic acid (PLA) polymer and blended with an optional minority amount of amorphous polylactic acid polymer, preferably in the ratio of 85 wt % crystalline PLA and 15 wt % amorphous PLA (this first layer blend can also be optionally blended with an amount of ethylene-acrylate copolymer to help enable high transverse orientation); 3) A coextruded skin layer for use as a coating-receiving layer including preferably crystalline PLA; 4) a coating layer which is in-line or off-line coated onto the surface of said coating-receiving skin layer opposite the heat sealable or non-heat sealable winding layer. This coating layer also provides a suitable surface for vapor deposition of metal (aka metal adhesion layer); 5) An optional (but preferred) "primer" layer of metal, preferably including or consisting of copper (although other metals can be contemplated) deposited upon one side of the coating layer; 6) A layer of metal, preferably including or consisting of aluminum (although other metals can be contemplated) deposited upon the side of said primer metal layer opposite the side contacting the coating layer.

Another embodiment of the inventive laminate film includes a similar construction as above, except without the inclusion of one or more layers, including but not limited to the heat sealable layer or the skin layer.

The first coextruded PLA layer can include either crystalline PLA resin or amorphous PLA resin or blends thereof. In the case where crystalline PLA resin is part of this layer's formulation, an amount of ethylene-acrylate copolymer can optionally be incorporated as in the core layer formulation to help enable high transverse orientation. Generally, it is preferable to use an amorphous PLA to impart heat sealable characteristics to this film design. If using this layer as a non-heat sealable layer, it is usually desirable to discharge-treat the exposed surface of this layer in order to provide further functionality as a surface to receive metallization, printing, coating, or laminating adhesives.

The coextruded first skin layer can be a heat sealable layer having a thickness after biaxial orientation of between 0.5 and 5 μm, preferably between 1.0 and 2.0 μm. The amorphous PLA is preferably based on a L-lactide isomer with D-lactide content of greater than 10 wt %. A suitable amorphous PLA to use is Natureworks® Ingeo™ 4060D grade. This resin has a relative viscosity of about 3.25-3.75, $T_g$ of about 52-58° C., seal initiation temperature of about 80° C., density of about 1.24 g/cm$^3$, a D-lactide content of about 12 wt %, and a maximum residual lactide in the polylactide polymer of about 0.30% as determined by gas chromatography. Molecular weight $M_w$ is about 180,000. The preferred amount to be used as a heat sealable skin layer is about 100 wt % of the layer. It is also preferred to add an amount of inorganic antiblock to this layer to aid in web-handling, COF control, film winding, and static control, among other properties. Suitable amounts would be about 1000-5000 ppm of the heat sealable resin layer, preferably 3000-5000 ppm.

The polylactic acid resin including the second, core layer is a crystalline polylactic acid of a specific optical isomer content and can be biaxially oriented. As described in U.S. Pat. No. 6,005,068, lactic acid has two optical isomers: L-lactic acid (also known as (S)-lactic acid) and D-lactic acid (also known as (R)-lactic acid). Three forms of lactide can be derived from these lactic acid isomers: L,L-lactide (also known as L-lactide) and which includes two L-lactic acid residuals; D,D-lactide (also known as D-lactide) and which includes two D-lactic acid residuals; and meso-lactide which includes one each of L and D-lactic acid residuals. The degree of crystallinity is determined by relatively long sequences of a particular residual, either long sequences of L or of D-lactic acid. The length of interrupting sequences is important for establishing the degree of crystallinity (or amorphous) and other polymer features such as crystallization rate, melting point, or melt processability. The crystalline polylactic acid resin is preferably one including primarily of the L-lactide isomer with minority amounts of either D-lactide or meso-lactide or combinations of D-lactide and meso-lactide. Preferably, the minority amount is D-lactide and the amount of D-lactide is 10 wt % or less of the crystalline PLA polymer. More preferably, the amount of D-lactide is less than about 5 wt %, and even more preferably, less than about 2 wt %. Suitable examples of crystalline PLA for this invention are Natureworks® Ingeo™ 4042D and 4032D. These resins have relative viscosity of about 3.9-4.1, a melting point of about 165-173° C., a crystallization temperature of about 100-120° C., a glass transition temperature of about 55-62° C., a D-lactide content of about 4.25 wt % and 1.40 wt % respectively, density of about 1.25 g/cm$^3$, and a maximum residual lactide in the polylactide polymer of about 0.30% as determined by gas chromatography. Molecular weight $M_w$ is typically about 200,000; $M_n$ typically about 100,000; polydispersity about 2.0. Natureworks® 4032D is the more preferred crystalline PLA resin, being more crystalline than 4042D and more suitable for high heat biaxial orientation conditions. In addition, the 4042D PLA grade contains about 1000 ppm of erucamide and for some applications, particularly for gas barrier metallizing, may not be suitable.

The second PLA resin-comprising layer can be of any thickness after biaxial orientation, but is typically 8 μm to 100 μm in thickness, preferably between 10 μm and 50 μm, and more preferably between about 15 μm and 25 μm in thickness. A preferred embodiment is to use the higher crystalline, higher L-lactide content PLA (lower wt % D-lactide of about 1.40) such as Natureworks® 4032D.

The core PLA resin-comprising layer can also optionally include an amount of amorphous PLA resin blended with the crystalline PLA to improve further extrusion processing and oriented film processing. The addition of amorphous PLA in the core layer helps to lower extrusion polymer pressure and in terms of film manufacturing, helps to reduce or slow crystallization rate of the newly oriented film. This aids in the orientation of the PLA film in both machine and transverse directions and helps reduce defects such as uneven stretch marks. It also helps with the slitting of the biaxially oriented film at the edge-trimming section of the film orientation line by reducing the brittleness of the edge trim and reducing the instances of edge trim breaks which can be an obstacle to good productivity. The amorphous PLA is preferably based on a L-lactide isomer with D-lactide content of greater than 10 wt %. A suitable amorphous PLA to use is Natureworks® Ingeo™ 4060D grade. This resin has a relative viscosity of about 3.25-3.75, $T_g$ of about 52-58° C., seal initiation temperature of about 80° C., density of about 1.24 g/cm$^3$, a D-lactide content of about 12 wt %, and a maximum residual lactide in the polylactide polymer of about 0.30% as determined by gas chromatography. Molecular weight $M_w$ is about 180,000. Suitable amounts of amorphous PLA to use in the first PLA resin-comprising layer are concentrations of up to about 48 wt % of the first layer, preferably up to about 30 wt % of the first layer, and even more preferably about 15 wt % of the first layer. It should be noted, however, that too much amorphous PLA in the first layer (e.g. 50% or greater) can cause high thermal shrinkage rates after biaxial orientation and in spite of heat-setting conditions in the transverse orientation oven to make a thermally stable film. A thermally, dimensionally stable film is important if the substrate is to be used as a metallizing, printing, coating, or laminating substrate. (However, if the BOPLA is desired as a shrinkable film, this composition and appropriate processing conditions might be suitable.)

Another optional component that can be blended into the primarily crystalline PLA second layer is a minority amount of ethylene-acrylate copolymer to enable high transverse orientation rates similar to that used in BOPP orientation, if desired. It may be desirable to do this as the higher orientation rate may be beneficial for profile control and economies of scale in terms of a wider film production. Ethylene-acrylates are of the general chemical formula of $CH_2{=}C(R^1)CO_2R^2$ where $R^1$ can be hydrogen or an alkyl group of 1-8 carbon atoms and $R^2$ is an alkyl group of 1-8 carbon atoms. Ethylene-acrylate copolymers contemplated for this invention can be based on ethylene-acrylate, ethylene-methacrylate, ethylene-n-butyl acrylate-glycidyl methacrylate, ethylene-glycidyl methacrylate, ethylene-butyl-acrylate, ethylene acrylic esters, or blends thereof. Ethylene vinyl acetate (EVA) and ethylene methacrylate (EMA) can also be contemplated. Other similar materials may also be contemplated. As described in U.S. Pat. No. 7,354,973, suitable compositions of the ethylene-acrylate copolymers can be about 20-95 wt % ethylene content copolymerized with about 3-70 wt % n-butyl acrylate and about 0.5-25 wt % glycidyl methacrylate monomers. A particularly suitable ethylene-acrylate copolymer of this type is one produced by E. I. DuPont de Nemours and Company Packaging and Industrial Polymers Biomax® Strong 120. This additive has a density of about 0.94 g/cm$^3$, a melt flow rate of about 12 g/10 minutes at 190° C./2.16 kg weight, a melting point of about 72° C., and a glass transition temperature of about −55° C. Other suitable ethylene-acrylate copolymer impact modifiers commercially available are: Dupont Elvaloy® PTW, Rohm & Haas, Inc. BPM500, and Arkema, Inc. Biostrength® 130.

Suitable amounts of ethylene-acrylate copolymer to be blended in the crystalline PLA-comprising core layer is from about 2-10 wt % of the first layer, preferably about 2-7 wt % and more preferably, about 3-5 wt %. At these concentrations, acceptable clarity of the biaxially oriented film is maintained. Too much ethylene-acrylate may cause haziness; too little may not enable transverse orientation at high rates like 8-10×. Blending into the first layer can be done most economically by dry-blending the respective resin pellets; it is contemplated that more aggressive blending such as melt-compounding via single-screw or twin-screw can result in better dispersion of the ethylene-acrylate copolymer throughout the PLA matrix.

Additionally, the PLA-comprising core layer may also include an optional minority amount of antiblocking additives when considering a 2-layer coextruded film substrate embodiment. In such an embodiment, the surface of the core layer opposite the first heat sealable layer would be the coating receiving layer. It is often desirable to add an amount of antiblocking agent to this first PLA resin-comprising metal receiving layer for aiding machinability and winding. An amount of an inorganic antiblock agent can be added in the amount of about 100-5000 ppm of the first PLA resin-comprising layer, preferably about 300-2000 ppm. Preferred types of antiblock are spherical sodium aluminum calcium silicates or an amorphous silica of nominal 2-6 μm average particle diameter, but other suitable spherical inorganic antiblocks can be used including crosslinked silicone polymer (such as Momentive Performance Material Inc.'s Tospearl® grades of polymethylsilsesquioxane of nominal 2.0 and 3.0 μm sizes) or polymethylmethacrylate, and ranging in size from about 2 μm to 6 μm. Preferred is a nominal 3 μm spherical sodium aluminum calcium silicate manufactured by Mizusawa Chemicals under the tradename Silton® JC-30 at a loading of about 500 ppm in the first PLA resin-comprising layer.

Preferred types of antiblock are spherical, crosslinked silicone polymer such as Momentive's Tospearl® grades of polymethylsilsesquioxane of nominal 2.0 and 3.0 µm sizes. Alternatively, sodium aluminum calcium silicates of nominal 3 µm in diameter can also be used (such as Mizusawa Silton® JC-30), but other suitable spherical inorganic antiblocks can be used including polymethylmethacrylate, silicas, and silicates, and ranging in size from about 2 µm to 6 µm. Migratory slip agents such as fatty amides or silicone oils can also be optionally added to the heat seal resin layer of types and quantities mentioned previously if lower COF is desired. However, if the films of this invention are desired to be used for metallizing, it is recommended that the use of migratory slip additives be avoided in order to maintain metallized barrier properties and metal adhesion.

The third coextruded coating-receiving layer is comprised of PLA, preferably crystalline PLA should be used, either by itself or as the majority component of a blend with amorphous PLA. However, it can be contemplated that the coating-receiving layer can be substantially amorphous PLA as well. The use of amorphous PLA could help improve adhesion of the coating to the PLA substrate. As discussed previously, if crystalline PLA is used for this layer, an optional amount of ethylene-acrylate copolymer can be used as part of this layer to aid transverse orientation rates. Suitable amounts of ethylene-acrylate copolymer to use in this skin layer are about 2-10 wt %, preferably about 2-7 wt % and, more preferably, about 3-5 wt %. Preferably, non-migratory inorganic slip and/or antiblock additives as described previously should be used to maintain gas barrier properties and metal adhesion if metallizing, or ink wetting and ink adhesion if printing. It is also preferred to add an amount of inorganic antiblock to this layer to aid in web-handling, COF control, film winding, and static control, among other properties. Suitable amounts would be about 100-1000 ppm of this coating-receiving layer, preferably about 300-500 ppm. Preferred types of antiblock are spherical crosslinked silicone polymer such as Momentive's Tospearl® grades of polymethylsilsesquioxane of nominal 2.0 and 3.0 µm sizes. Alternatively, sodium aluminum calcium silicates of nominal 3 µm in diameter can also be used (such as Mizusawa Silton® JC-30), but other suitable spherical inorganic antiblocks can be used including polymethylmethacrylate, silicas, and silicates, and ranging in size from about 2 µm to 6 µm. It is often preferred to discharge-treat the exposed side of this layer so as to enable adequate adhesion and wet-out of the inventive coatings to this side.

The coextrusion process can include a multi-layered compositing die, such as a two-, three-, or four-layer die (or more). In the case of a 2-layer coextruded film embodiment, a two-layer compositing die can be used. One embodiment as described previously is to coextrude two layers including a first PLA resin-containing layer and a heat sealable amorphous PLA resin-containing layer.

In the case of a 3-layer coextruded film, a 3-layer compositing die can be used whereby a PLA resin-containing core layer can be sandwiched between the heat sealable amorphous PLA resin layer and the first PLA resin-containing layer which is also the coating-receiving layer.

If the three-layer coextruded film embodiment is chosen, the first PLA resin-containing layer coextruded on one side of the PLA core layer is the coating-receiving layer; the skin layer coextruded on the opposite side of the PLA core layer may be a heat sealable resin layer. Both the first PLA resin-containing layer and the heat sealable skin layer preferably have a thickness after biaxial orientation between 0.5 and 5 µm, preferably between 0.5 and 3 µm, and more preferably between 1.0 and 2.0 µm.

The coatings of interest may be applied in two methods: Via in-line coating between the two sequential steps of machine and transverse direction orientation; or via off-line coating wherein the coating is applied on an already formed biaxially oriented film. In this latter case, a BOPLA substrate film can be made as described above—without the in-line coating steps—and wound into roll form. This uncoated film can then be processed in a separate off-line coater where the coating can be applied in various ways known in the art via gravure roll or metering rod, preferably gravure. Alternatively, biaxially oriented PLA film can be obtained commercially from Bi-Ax International Inc. under the tradename Evion®. Evion® is a biaxially oriented polylactide film where one side is heat sealable. The film has about a 20 µm thickness, a yield of about 40.3 m²/kg, a machine direction tensile strength of about 62 N/mm², and a transverse direction tensile strength of 103 about N/mm². These coatings are applied to the coating receiving side of the film—which may be discharge-treated or not, but preferably discharge-treated to a dyne level of at least about 38 dynes/cm—dried in an air flotation oven and wound back up into roll form. The film roll was then placed in a vacuum deposition metallizing chamber and metallized with aluminum at an optical density of about 2.2-3.2.

Particularly suitable coatings for the PLA substrate films are blends of varying quantities of EVOH and PVOH and crosslinker. These coatings have been found to significantly improve moisture barrier properties. Suitable materials include: Kuraray Exceval® RS-117 EVOH, Celanese Celvol® 24-203, Celvol® 103, Celvol® 125 or Celvol® 502 PVOH, and Freechem® 40 DL or Polycup 172 crosslinker coatings, plus a small amount of defoamer, preferably Air Products Surfynol 420 (typically about 0.10 wt % NVS (non-volatile solids) of the coating solution). This formulation can be applied in-line via a reverse gravure roll coating process onto the desired coating receiving layer side of the PLA film coextrusion or applied off-line onto an already formed PLA film substrate. A preferred embodiment is to apply the coating via an off-line coater using reverse gravure roll.

It is also preferable to discharge-treat the coating receiving side of the PLA film coextrusion prior to coating to ensure adequate wet-out of the coating onto the substrate. (However, the surface energy of PLA is high enough that this step could be skipped, but to ensure best coating laydown, it is preferred to discharge-treat the substrate prior to coating via any of several methods such as electrical corona discharge, flame treatment, or other discharge treatment methods.)

Exceval® RS-117 is a fully hydrolyzed EVOH powder with a viscosity of about 23-30 mPa-sec, a degree of hydrolysis of about 97.5-99.0%, a maximum ash content of about 0.4%, a maximum volatile content of about 0.5%, molecular weight $M_w$ of about 130,000 g/molm and $M_n$ of about 53,000 g/mol. Celvol® 24-203 is a partially hydrolyzed PVOH solution at about 23% wt non-volatile solids (NVS), with about 88.00+/−1.00 mol-% hydrolysis, a 4 wt % solids solution, a viscosity of about 4.00+/−0.50 cP, containing total volatiles of about 5.00 wt % maximum, a methanol maximum of about 0.90 wt %, an ash maximum of about 0.90 wt %, and a 4 wt % solution pH of about 5.50+/−1.00. Celvol® 103 is a partially hydrolyzed PVOH solution at about 23% wt non-volatile solids (NVS), with about 88.00+/−1.00 mol-% hydrolysis, a 4 wt % solids solution, a viscosity of about 4.00+/−0.50 cP, containing total volatiles of about 5.00 wt % maximum, a methanol maximum about 0.90 wt %, an ash maximum of about 0.90 wt %, and a 4 wt % solution pH of about 5.50+/−1.00. Celvol® 125 is a super hydrolyzed PVOH solution with about 99.65+/−0.35 mol-% hydrolysis, a 4 wt % solids solution with viscosity of about 30.00+/−2.00 cP, containing total volatiles of about 5.00 wt % maximum, a methanol maximum of about 0.90 wt %, an ash maximum of about 1.20 wt %, and a 4 wt % solution pH of about 6.50+/−1.00. Celvol® 502 is a partially hydrolyzed PVOH solution with about 88.00+/−1.00 mol-% hydrolysis and a 4 wt % solids solution with a viscosity of about 3.35+/−0.35 cP. The Surfynol 420 defoamer has ethylene oxide content of about 1.3 mol % or about 20 wt %, specific gravity at 25° C. of about 0.943, pH in a 1% aqueous solution of about 6-8, viscosity at 20° C. is <250 cps, hydrophile-lipophile balance is about 4, and volatile organic compound content of (VOC, EPA method 24) about 28 wt %.

The Exceval® EVOH comes in solid form and needs to be dissolved in water (tap water can be used) in a vessel slowly heated to 90-95° C., while being stirred, and cooled slowly back to room temperature. EVOH solutions of about 5-12% wt NVS were made. This solution was then mixed with the other PVOH and crosslinker materials. The Celanese PVOH can be obtained as either already prepared aqueous solutions of nominal 23% wt NVS (e.g. Celvol 24-203) or as a solid powder (e.g. Celvol 103). If the latter, the PVOH powder is dissolved in water, heated slowly to 85-95° C., while being stirred, and cooled slowly back to room temperature. Different % solids solutions can be made as desired, ranging from about 12-16% wt NVS. The Emerald Performance Materials Freechem® 40 DL glyoxal or Hercules Polycup 172 epichlorohydrin was added to the PVOH/EVOH blend just prior to coating in order to prevent premature crosslinking of the PVOH. The Polycup 172 is a polyamide-epichlorohydrin crosslinker with about 12-12.5% wt NVS, viscosity at 25° C. of about 25-75 cps, a pH of about 4.0-5.5, and specific gravity at 21° C. of about 1.03. Freechem® is a glyoxal crosslinker composed of ethanedial with about 40 wt % NVS, less than about 0.8 wt % residual acid, a pH of about 3.0, a specific gravity of about 1.270, a boiling point of about 110° C., and a melting point of about 15° C. Preferably, the Freechem® glyoxal crosslinker is used.

If coating is applied in-line with PLA film orientation, said coated side was then dried in the transverse direction preheating oven zones prior to transverse direction stretching. After transverse stretching, the film was heat-set to minimize shrinkage. If coating is applied off-line on an already-formed PLA substrate, the coating is dried in an air flotation oven at drying temperatures such that the coating is fully dried and crosslinked and the PLA substrate film experiences minimal thermal shrinkage. The thickness of the crosslinked PVOH/EVOH coating on the BOPLA film ranged between about 0.005-0.015 mil (0.125-0.375 μm), preferably about 0.0075-0.010 mil (0.1875-0.25 μm) thick after drying. The film was wound in roll form. The film roll was then placed in a vacuum deposition metallizing chamber and metallized with aluminum at an optical density of about 2.2-3.2.

For in-line coating applications, the advantage of the above coating formulation is that it balances the properties of the EVOH and PVOH. Using EVOH as a 100 wt % non-volatile solids solution (i.e. with no PVOH) can result in a dried layer of EVOH that is highly crystalline and prone to cracking during the transverse orientation process. Such cracking can lead to loss of barrier properties, poor appearance, and poor metal adhesion if metallizing. Conversely, the use of PVOH by itself (i.e. with no EVOH) often does not have as effective of gas barrier properties as does the PVOH with the addition of EVOH. Crosslinking of the EVOH and PVOH components is also important as the crosslinked EVOH/PVOH provides better metal adhesion properties and reduces swelling of the EVOH/PVOH components by moisture. However, the combination of both the EVOH and PVOH components provide a unique blend that corrects these deficiencies, in particular for in-line coating applications used with biaxial orientation film-making processes. The PVOH component acts as a process aid that enables orientation of the EVOH component without cracking; the EVOH component helps improve gas barrier properties significantly.

Preferred blend ratios of the PVOH and EVOH components ranged from about 0.40-10.5 wt % non-volatile solids (NVS) and about 3.0-9.0 wt % NVS, respectively. More preferably, PVOH NVS wt % was about 1.0-8.0 and EVOH NVS wt % was about 3.5-6.5. Preferred amounts of crosslinker (e.g. glyoxal) include about 0.4-2.0 NVS wt %; preferably about 0.5-1.5. Total NVS wt % of the blend preferably range from about 4-21; preferably, total NVS wt % was 6.0-15.0.

It has been found that above 15.0 NVS wt % can result in severe foaming issues during coating; this can be mitigated in part by heating the coating to 120° F. (49° C.), but foaming at these higher NVS wt % can occur readily and will affect ability to achieve consistent coating uniformity and quality. The final thickness of the dried crosslinked PVOH/EVOH blend on the substrate may be about 0.10 μm-0.40 μm, preferably between about 0.125-0.375 μm, and more preferably between about 0.1875-0.25 μm.

If no PVOH is used and only the EVOH component is used in the coating blend (e.g. about 7.0-9.0 NVS wt %), it has been found that although good barrier properties can be obtained, metal adhesion on the coated EVOH substrate can be poor. The poor metal adhesion is believed to be due to cohesive failure within the EVOH coating which may be due to the EVOH's high glass transition temperature. Moreover, if this EVOH-only coating formulation is applied via in-line coating prior to transverse orientation in a film-making line, dried coating appearance tends to be poor and barrier properties could be poorer due to cracking of the solution-grade EVOH layer during transverse orientation.

If no EVOH is used and only the PVOH component is used in the coating blend (e.g. about 4.0-13.0 wt % NVS), without any crosslinker added, it has been found that metal adhesion and gas barrier are poorer. As in the case with EVOH by itself, it is believed that the high Tg of solution-grade PVOH results in cohesive failure within the PVOH layer, resulting in poor metal adhesion. The addition of crosslinker, however, appears to improve this situation by increasing crosslink density and cohesive strength. In fact, it is desirable to crosslink both the EVOH and PVOH used in the blends described above.

It has been found that blends of EVOH and PVOH appear to address adequately the issues of obtaining good barrier properties, good metal adhesion, and good appearance as well as the ability to use such blended formulations for both in-line coating applications as well as off-line coating applications. Using less EVOH than prescribed can result in poorer gas barrier properties as the prescribed amount of EVOH used is very effective in obtaining high gas barrier properties. Using more EVOH than prescribed can resulted in more foaming issues as the solution viscosity increases very quickly and can make the coating blend more prone to cracking, particularly for in-line coating applications. Using more PVOH than prescribed can also result in more foaming issues due to increase in solution viscosity and can affect the gas barrier properties adversely as it is not as effective as EVOH for gas barrier. Using less PVOH than prescribed can result in poorer barrier properties as the EVOH component of the blend can become more prone to cracking; particularly for in-line coating applications, the PVOH component can act as a "process aid" for the highly crystalline solution grade EVOH during transverse orientation. Thus, the correct blend of EVOH and PVOH can balance the desirable properties of gas barrier, metal adhesion, appearance, and processability.

In addition to the crosslinked PVOH/EVOH blends described above, other coatings have been found that also improve the moisture barrier properties of PLA film substrates, especially after metallizing. Vinyl alcohol-vinylamine (PVAm) copolymer coatings have also shown effectiveness in improving moisture barrier properties, either crosslinked or uncrosslinked. These materials can be commercially obtained from Celanese under the trade names L12 and M6 or from Mitsubishi Chemicals under the trade name Diafix®. Celanese L12 is a vinyl alcohol-vinylamine copolymer containing nominal 12 mol % vinyl amine and 88 mol % vinyl alcohol, with an amine content of about 2.3-2.6 meq $NH_2$/gram, an average $M_w$ of about 10,000-20,000, a viscosity at 20° C. in the 4% aqueous solution of about 5-10 cps, a pH in the 4% aqueous solution of about 9-12, a Tg for the powder of about 85-100° C., and a melting point for the powder of about 180-220° C. Celanese M6 is a vinyl alcohol-vinylamine copolymer containing nominal 6 mol % vinyl amine and 94 mol % vinyl alcohol, with an amine content of about 1.1-1.3 meq $NH_2$/gram, an average $M_w$ of about 80,000-140,000, a viscosity at 20° C. in the 4% aqueous solution of about 12-20 cps, a pH in the 4% aqueous solution of about 9-12, a Tg for the powder of about 85-100° C., and a melting point for the powder of about 180-220° C. Mitsubishi Chemicals Diafix® 631 is a vinyl alcohol-vinylamine copolymer with nominal 87.0 mol % vinyl alcohol and 13.0 mol % vinyl amine. It has a viscosity at 30° C. in a 4% aqueous solution of about 15.2 mPa-s, and a pH in a 4% aqueous solution of about 10.8. Both L12, M6, and Diafix® can be readily dissolved in water up to about 20 wt % and can be crosslinked if desired with glyoxal or epichlorohydrin such as available from Freechem or Hercules as Polycup® 172 respectively. These vinyl alcohol-vinylamine copolymers can also be blended in solution with PVOH, EVOH, or both. These coatings can be applied either in-line or off-line onto the PLA film substrate. In general, target coating weight after drying was about 0.28 g/m² or about 0.17 lbs/ream, or about 0.010 mil thickness (0.25 μm). However, coating thickness after drying could range between about 0.005 mil (0.125 μm) to about 0.015 mil (0.375 μm).

Further, anionic carboxylated styrene-butadiene copolymer (SBR) emulsions have also been found to improve the moisture barrier property of BOPLA films, especially after metallization with aluminum vapor deposition. In particular, SBR emulsions from Mallard Creek Polymers BarrierPro® and Rovene® grades are preferred. BarrierPro® 4550 is an anionic carboxylated styrene-butadiene copolymer latex with about 49.0-51.0% NVS, a pH of about 9.5-10.0, a Brookfield viscosity of about 900 max cps, and a Tg of about 1° C. Mallard Creek Polymers Rovene® 4019 is an anionic carboxylated styrene-butadiene copolymer emulsion having about 53.0% NVS, a pH of about 7.25, a Brookfield viscosity of about 580 cps, a Tg of about 14° C., and bound styrene of about 62%. Lastly, Mallard Creek Polymers Rovene® 4100 is also an anionic carboxylated styrene-butadiene copolymer emulsion but with about 50.0% NVS, a pH of about 6.3, a Brookfield viscosity of about 300 cps, a Tg of about −5° C., and bound styrene of about 57%. These SBRs can be applied to the BOPLA substrate in either in-line or off-line coating processes and coating thicknesses similar to as those described previously.

Additionally, it is contemplated that blends of the various coatings of interest described above can give synergistic effects for gas barrier and metal adhesion or for optimization of said properties.

As a base film for metallization, the coated test rolls were placed inside a vacuum chamber metallizer for vapor deposition metallization using aluminum at an optical density of about 1.5-5.0, preferably about 2.2-3.2, and more preferably about 2.4. Optionally but preferably, prior to aluminum deposition, the film is treated using a type of sputtering with a copper or titanium cathode, preferably copper. This treater is typically set up in the low vacuum section of the metallizer where the unwinding roll is located and the film is passed through this treater prior to entering the high vacuum section of the metallizer where the evaporation boats are located. The treater uses high voltage between the anode and cathode to produce free electrons. Oxygen gas, argon gas, nitrogen gas, or blends thereof—preferably nitrogen gas—is introduced into the treater and the free electrons combine with the gas to produce ions. Magnetic fields guide and accelerate the ions onto the copper cathode target which then emit copper ions. These copper ions are deposited onto the polylactic acid polymer substrate, creating a monolayer of copper, ca. 20-2000 ng/m² (nanogram/sq. meter) thick. This method of applying a "primer" layer of copper or other metals prior to aluminum deposition, has been found to be efficacious in improving further gas barrier and metal adhesion properties. U.S. patent application Ser. No. 12/542,428 which describes this process is wholly incorporated by reference.

Moreover, further embodiments that may be contemplated can also involve over-coating of the metallized layer with these coating formulations. For example, instead of coating the substrate with these formulations, drying the coating, and then depositing metal onto the dried coating, it can also be contemplated to deposit the metal onto the substrate first, and then to subsequently apply the coating formulation of interest upon the metallized layer's surface via an off-line coating method, drying the coating and thus produce a suitable high barrier film product. This embodiment may be of interest not only for high gas and moisture barrier, but also as a protective layer covering the metallized layer from scratches, scuffs, etc.

Examples and Comparative Examples

In one embodiment, multi-layer coextruded BOPLA film was made using a 1.5 m wide pilot line sequential orientation process with about 85 wt % Natureworks® PLA4032D and about 15 wt % Natureworks® PLA4060D as core layer (2); one coextruded sealant layer (3) of substantially Natureworks® PLA4060D upon one side of the core layer (2); and the coating receiving layer (1) of about 85 wt % Natureworks® PLA4032D and about 15 wt % Natureworks® PLA4060D was coextruded upon the side of the core layer (2) opposite the sealant layer (3), via coextrusion through a die. An amount of antiblock was incorporated into the skin layers (1) and (3) for web handling. A suitable antiblock is Mizusawa Silton® JC-30 or JC-20 which can be made into a masterbatch using PLA resin as a carrier resin. The coating receiving layer (1) used Silton® JC-20 nominal 2.0 μm spherical sodium calcium aluminum silicate; for the amorphous PLA heat sealable layer, Silton® JC-30 3.0 μm spherical sodium calcium aluminum silicate was used. The antiblock loading was about 300 ppm on the coating receiving layer (1); and about 1500 ppm in the heat sealable amorphous PLA layer (3).

The coextruded film is cast onto a chill drum using an electrostatic pinner, oriented in the machine direction through a series of heated and differentially sped rolls, followed by transverse direction stretching in a tenter oven. The multi-layer coextruded laminate sheet is coextruded at processing temperatures of ca. 190° C. to 215° C. through a die and cast onto a cooling drum whose surface temperature is controlled between about 15° C. and 26° C. to solidify the non-oriented laminate sheet at a casting speed of about 6 to 13 mpm. The non-oriented laminate sheet is stretched in the longitudinal direction at about 45° C. to 60° C. at a stretching ratio of about 3 times the original length and the resulting stretched sheet is annealed at about 30° C. to 45° C. to obtain a uniaxially oriented laminate sheet. The uniaxially oriented laminate sheet is introduced into a tenter at a linespeed of ca. 18 to 39 mpm and preliminarily heated between about 65° C. and 75° C., and stretched in the transverse direction at about 75° C. to 95° C. at a stretching ratio of about 5 times the original length and then heat-set or annealed at about 120° C. to 130° C. to reduce internal stresses due to the orientation and minimize shrinkage and give a relatively thermally stable biaxially oriented sheet.

After biaxial orientation, the thickness of the coextruded film overall was nominal 80G (20 µm); the coating receiving layer (1) was nominal 4G (1.0 µm); the sealant layer (3) was nominal 6G (1.5 µm); and the core layer (2) was nominal 70G (17.5 µm). The film was heat-set or annealed in the final zone of the tenter oven to reduce internal stresses and minimize heat shrinkage of the film and maintain a dimensionally stable biaxially oriented film. The side of the coating receiving layer opposite the core layer was treated via corona discharge treatment method after orientation. The BOPLA multi-layer film was wound in roll form for further processing such as coating or metallizing upon the discharge-treated surface.

In another embodiment, Bi-Ax International's commercially available Evlon® BOPLA film, nominal 20 µm thick, one side heat sealable, one side discharge-treated, was used as the PLA film substrate. The coating receiving layer was the discharge-treated side of the film (non-heat sealable side) and had a dyne level of about 38-44 dyne-cm/cm.

A roll of the BOPLA film was mounted on the unwind stand of an off-line solution coater, about 65 inches (ca. 1.65 m) width. The treated side of the PLA film was coated with an aqueous coating formulation of the respective examples as shown in Table 1 using a 200 line screen rotoflow Quad gravure cylinder in a reverse-gravure open-pan applicator with 64¾ inch (1645 mm) backing roll. Coating speed was about 400-600 fpm (ca. 122-183 mpm), preferably about 550 fpm (168 mpm). The coated film was dried in an 3-zone air flotation oven at about 170-190° F. (ca. 76-88° C.), such that any thermal shrinkage of the BOPLA film was kept to a minimum (e.g. less than 0.5% shrinkage, and preferably none). After drying, the coated PLA film was wound into roll form for metallizing. The dried coating thickness was about 0.15-0.35 µm in thickness, preferably about 0.20-0.25 µm thickness.

The total % NVS of the aqueous coating solutions of interest is from about 3-30 wt %, preferably about 10-20 wt %, and more preferably about 12-15 wt % with a viscosity of less than 200 cps, preferably about 100-200 cps. The higher the percent non-volatile solids, the more cost-effective the coating is as less water needs to be driven off. However, the higher the % solids become, the more viscous the coating becomes, and the more difficult it may become to process due to foaming, slinging, etc. The coating may optionally be heated to about 120° F. (49° C.) to further aid lowering the coating viscosity and reducing foaming tendency.

The coated film roll was then placed in vacuum metallizer for vapor deposition of aluminum upon the coated surface. The metal layer optical density was about 2.2-3.2, preferably about 2.4. A preferred embodiment was to "pre-treat" or "prime" the coated surface of the film prior to aluminum deposition within the metallizing vacuum chamber, using a glow discharge sputtering process as described previously, using a copper cathode target at a voltage of about 401.62 v and using nitrogen gas at a flow rate of about 1.5 liter/min. After deposition of this copper primer layer upon the coated surface, this primed substrate was followed by vapor deposition of aluminum to a nominal optical density target of 2.4. The metallized rolls were then slit on a film slitter and tested for properties. Metallizing linespeed was about 305 mpm. The "primed" and metallized coated roll was then slit on a film slitter for evaluation.

The metallized and unmetallized coated BOPLA film samples were then tested for appearance and barrier properties, and when applicable, coating and metal adhesion. The following Table 1 illustrates the properties of various Examples and Comparative Examples:

TABLE 1

| Sample | Coating Blend Composition (NVS wt %) | | | | Total NVS (%) | Dried Coating thickness (um) | Coating Appearance 1-4 (1 = poor, 4 = excellent) | Metall. MVTR g/100 in²/day (g/m²/day) |
|---|---|---|---|---|---|---|---|---|
| Ex. 1 | EVOH RS2117 (3.71 wt %) | PVOH Celvol 24-203 (7.72 wt %) | Xlinker Freechem 40 DL (1.62 wt %) | Surfynol 420 (0.09 wt %) | 13.14 | 0.25 | 4 | 0.049 (0.76) |
| Ex. 2 | EVOH RS2117 (3.70 wt %) | PVOH Celvol 24-203 (7.72 wt %) | Xlinker Polycup 172 (1.0 wt %) | Surfynol 420 (0.09 wt %) | 12.51 | 0.20 | 4 | 0.058 (0.90) |
| Ex. 3 | PVOH Celvol 103 (1.01 wt %) | PVOH Celvol 125 (3.0 wt %) | Xlinker Polycup 172 (0.12 wt %) | | 4.13 | 0.255 | 4 | 0.055 (0.85) |
| Ex. 4 | PVOH Celvol 502 (8.72 wt %) | | Xlinker Freechem 40 DL (0.88 wt %) | | 9.6 | 0.19 | 4 | 0.055 (0.85) |
| Ex. 5 | PVAm Celanese L12 (3.0 wt %) | PVOH Celvol 125 (4.0 wt %) | | Surfynol 420 (0.10 wt %) | 7.1 | 0.20 | 4 | 0.070 (1.09) |
| Ex. 6 | PVAm Diafix | PVOH Celvol | | | 7.14 | 0.22 | 4 | 0.064 (0.99) |

TABLE 1-continued

| Sample | Coating Blend Composition (NVS wt %) | | | Total NVS (%) | Dried Coating thickness (um) | Coating Appearance 1-4 (1 = poor, 4 = excellent) | Metall. MVTR g/100 in²/day (g/m²/day) |
|---|---|---|---|---|---|---|---|
| | 631 (2.57 wt %) | 125 (4.57 wt %) | | | | | |
| Ex. 7 | PVAm Celanese M6 (10.0 wt %) | | Xlinker Polycup 172 (0.19 wt %) | 10.19 | 0.25 | 4 | 0.012 (0.19) |
| Ex. 8 | SBR BarrierPro 4550 (13.0 wt %) | | | 13.0 | 0.25 | 3 | 0.04 (0.62) |
| Ex. 9 | SBR Rovene 4019 (26.0 wt %) | | | 26.0 | 0.24 | 3 | 0.03 (0.47) |
| CEx. 1 | 0 | 0 | 0 | 0 | NA | NA | 0.29 (4.50) |

As Table 1 shows, Comparative Example 1 (CEx 1), which is a control film using uncoated metallized BOPLA the substrate film, had MVTR barrier that was 0.29 g/100 in²/day (4.50 g/m²/day). This value is typical for metallized BOPLA film. This barrier property, however, is not suitable for packaging products that require high moisture barrier applications.

Examples 1 to 4 (Ex. 1-Ex. 4) used blends of EVOH and PVOH as well as PVOH alone with crosslinker to obtain a dried crosslinked vinyl alcohol coating upon the BOPLA substrate which is subsequently metallized upon the coated layer via vapor deposition. As Table 1 shows, these Examples show a substantial improvement in moisture barrier properties compared to CEx.1. In particular, Ex. 1 using the Freechem glyoxal crosslinker shows very good moisture barrier.

Examples 5 to 7 (Ex. 5-Ex. 7) used PVOH and PVAm (poly-vinyl alcohol-vinyl amine copolymer) blends as well as PVAm alone with and without crosslinkers as a dried coating upon the BOPLA substrate which is then metallized upon the coated layer. These Examples also show substantial improvement in moisture barrier properties compared to CEx. 1. In particular, Example 7's Celanese M6 PVAm blended with epichlorohydrin crosslinker showed very good moisture barrier after metallization.

Examples 8 and 9 (Ex. 8, Ex. 9) used anionic carboxylated styrene-butadiene copolymer emulsions as the coating layer upon the BOPLA substrate which is then metallized upon the coated layer. These Examples show a substantial improvement in moisture barrier property when compared to CEx. 1.

Thus, there has been found a solution to provide significantly improved barrier films made by in-line or off-line coating of BOPLA substrates with excellent appearance utilizing EVOH, PVOH, and crosslinker; vinyl alcohol-vinyl amine copolymers; and styrene-butadiene rubbers either alone or in blends with each other. The use of these coatings provides a surprisingly significant improvement in moisture barrier, particularly after metallizing, over uncoated metallized BOPLA films.

Figure 2:
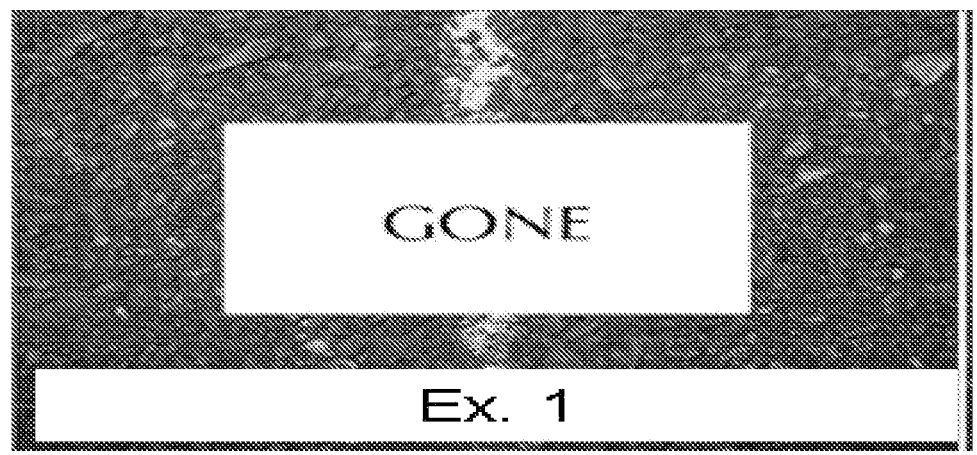
FIG. 2 illustrates compostability testing (ASTM D6400) at week 9 of a 26 week test of a sample prepared according to Example 1.
Figure 3:
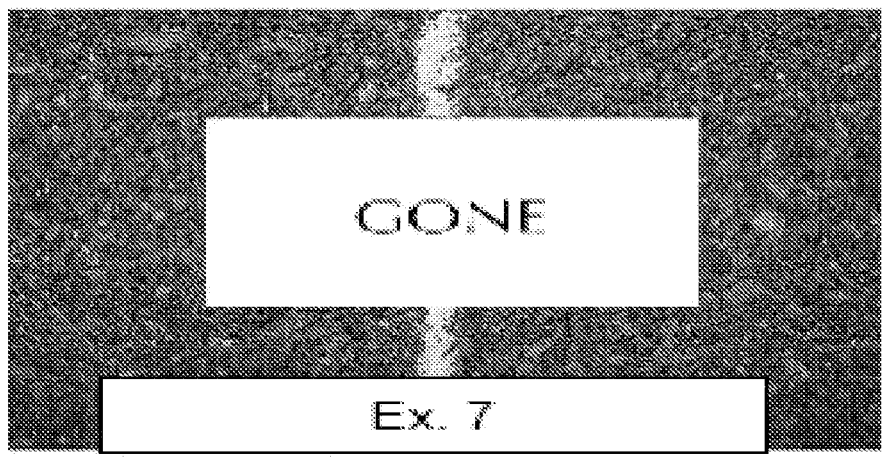
FIG. 3 illustrates compostability testing (ASTM D6400) at week 9 of a 26 week test of a sample prepared according to Example 7.
Figure 4:
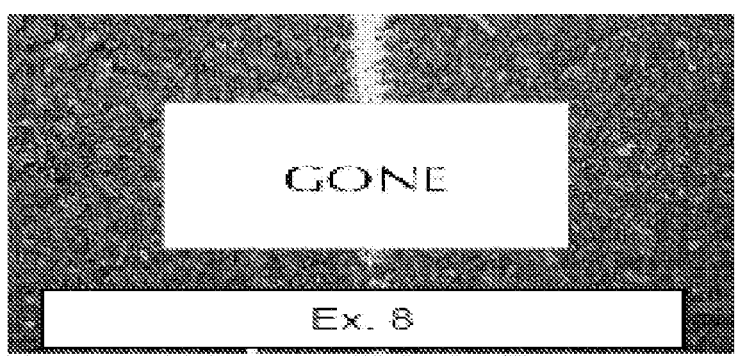
FIG. 4 illustrates compostability testing (ASTM D6400) at week 9 of a 26 week test of a sample prepared according to Comparative Example 8.

Moreover, the degradability of these coated BOPLA films is maintained since the coatings are relatively thin compared to the overall substrate and the coatings tend to fragment and disappear along with the BOPLA substrate. FIGS. 1-4 show CEx. 1 and some of the Examples (Ex. 1, Ex. 7, Ex. 8) undergoing compostability testing (ASTM D6400) at week 12 of a 26 week test. As can be seen in these figures, the uncoated BOPLA film CEx. 1 and Ex. 1 degraded completely after 12 weeks exposure in a compost medium at 58° C. Ex. 7 and Ex. 8 also degraded completely after 12 weeks. The ASTM D6400 test for compostable plastics has a duration of 26 weeks. If the subject sample degrades completely within that timeframe, it is deemed a "compostable plastic."

Test Methods

The various properties in the above examples were measured by the following methods:

Haze of the film was measured using a Gardner Instruments "Haze-Gard Plus" haze meter substantially in accordance with ASTM D1003. Desired haze value for a single sheet of film was 3% or less.

Moisture transmission rate of the film was measured by using a Mocon Permatran 3/31 unit substantially in accordance with ASTM F1249. In general, preferred values of MVTR would be equal or less than 0.15 g/100 in²/day (2.33 g/m²/day) at 100° F. (38° C.) and 90% relative humidity.

Oxygen transmission rate of the film was measured by using a Mocon Oxtran 2/20 unit substantially in accordance with ASTM D3985. In general, preferred values of $O_2TR$ would be equal or less than 3.0 cc/100 in²/day (46.5 cc/m²/day) at 73° F. (23° C.) and 0% relative humidity and preferably, less than 2.0 cc/100 in²/day (3.1 cc/m²/day).

Appearance was rated qualitatively using a ranking system of 1-4, with 1 equating to very poor appearance and 4 equating to excellent appearance. 8½"×11" (21.6 cm×28 cm) cut sheet samples of the films were inspected by eye and rated as follows:

1=Large preponderance of defects
2=Some defects
3=Few defects
4=No visible defects In general, the preferred value for appearance was at least a 3 rating.

Wetting tension of the surfaces of interest was measured substantially in accordance with ASTM D2578-67. In general, the preferred value was equal to or greater than 38 dyne/cm.

Metal adhesion was measured by heat sealing on a SENTINAL Sealer model 12 ASL at 220° F. (104.4° C.) seal temperature, 15 second dwell, and 15 psi (103.42 kPa) seal jaw pressure, a piece of 1-mil (25 μm) thick Ethylene Acrylic Acid polymer film (EAA) to the metallized surface of a single sheet of metallized film and measuring the 180° peel strength of the metal from the substrate substantially in accordance with AIMCAL (Association of Industrial Metallizers, Coaters, and Laminators) test procedure TP-105-92. The test procedure and a kit of materials can be obtained from AIMCAL's website www.aimcal.com. The Metal Adhesion Test Kit is designed to permit testing using TP-105-92. The test kit contains 2 rolls of 3M™ tape #610, 2 rolls of EAA film and an AIMCAL Metallizing Technical Reference Manual. The test kit contains enough material to do at least 100 tests as described in the Technical Reference Manual, (TP-105-92). The test procedure used in testing the samples used in the examples of this application is described in AIMCAL Metallizing Technical Reference (Third Edition, © 2001). In general, acceptable values of metal adhesion was a minimum of 50 g/in (50 g/25 mm), and preferably about 100 g/in (100 g/25 mm) or higher.

Compostability or degradability of the test films was done substantially in accordance with ASTM D6400 for "Compostable Plastics." In general, the film is desired to be visibly gone after the test duration of 26 weeks, and preferably within 15 weeks.

This application discloses several numerical ranges in the text and figures. The numerical ranges disclosed inherently support any range or value within the disclosed numerical ranges even though a precise range limitation is not stated verbatim in the specification because this invention can be practiced throughout the disclosed numerical ranges.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

What is claimed as new and desired to be protected by Letters Patent of the United States is:

1. A laminate film comprising:
   a multi-layer biaxially oriented polylactic acid film;
   a coating layer formed from a coating solution comprising vinyl alcohol-vinyl amine; and
   a metal layer applied by vacuum deposition on a surface of the coating layer, wherein the laminate film has a moisture transmission rate equal to or less than 0.15 g/100 in$^2$/day.

2. The laminate film of claim 1, wherein the coating solution further comprises a polyvinyl alcohol (PVOH).

3. The laminate film of claim 1, wherein the coating solution further comprises a crosslinking agent.

4. The laminate film of claim 1, wherein the metal comprises aluminum.

5. The laminate film of claim 1, further comprises a non-contiguous primer metal layer on a surface of the coating layer and a metal layer applied by vacuum deposition on the primer metal layer, wherein the primer layer comprises copper or titanium.

* * * * *